June 2, 1970 H. SCHMID 3,515,859
DIGITAL FILTERING OF ANALOG SIGNALS
Filed Dec. 27, 1965

United States Patent Office 3,515,859

Patented June 2, 1970

3,515,859

DIGITAL FILTERING OF ANALOG SIGNALS

Hermann Schmid, Binghamton, N.Y., assignor to General Electric Company, a corporation of New York Filed Dec. 27, 1965, Ser. No. 516,515
Int. Cl. G06j
U.S. Cl. 235—150.5 7 Claims

ABSTRACT OF THE DISCLOSURE

A filter for pulse-width signals for bringing about a smooth transition of output pulse-width signal for a step function change in input pulse-width signal. In a modified form, the filter passes a rapid transition in input pulse-width signal but returns to original value. Digital components are used to desynchronize a slave from a master counter by adding or subtracting counts reflecting a change in pulse-width incoming signal as modified in accord with a selected filter time constant.

This invention relates to electronics apparatus for providing analog signal filtering without requiring the use of large reactive elements. While the invention is most useful in control apparatus of the type in which information is represented in whole or in part as pulse-width signals, it can be employed generally by using conventional apparatus to convert the information signals to pulse-width form.

In control systems design, a common requirement is to filter signals so as to provide low-pass, high-pass, band-pass or band-stop functions. With electronic circuits using practical resistance values, very large values are required for the capacitors or inductors if large time constants are involved. Large value precision capacitors and inductors are very expensive and very large in size. For example, if an operational amplifier provides the load and has drift characteristics which limit its permitted input resistance to 10KΩ, a capacitance of 100$\mu$f. is required to provide a time constant of 1 second for integration. For integrated circuit types of construction, reactors having such large values are far beyond existing capabilities. As separate components, they are incongruously large, many times the size of the rest of the circuits.

Also, capacitors are significantly temperature dependent. Allowances for variations of capacitance with temperature generally cause difficult design problems to produce the necessary circuit tolerance, especially for demanding applications having severe environments.

Usually, the application of filters requires that the filter be compatible with an existing design for the source of input signals and the output load circuits. It is the filter which makes whatever accommodations are required. Furthermore, basic components must be changed when the filter frequency requirements are changed. While the considerations involved are normally of an elementary nature, they present opportunities for errors and performance shortcomings because of reliance on component values and tolerances.

Accordingly, it is an object of the invention to eliminate filter reactor size requirements arising from reactors having large values of capacitance and inductance.

It is a further object of the invention to avoid temperature dependence of filters incorporating capacitors and inductors.

It is an additional object of the invention to provide digital apparatus for performing analog filtering functions.

It is another object of the invention to provide filter circuits which are readily modified and adapted for particular applications.

It is another object of the invention to provide apparatus for filtering pulse-width signals directly without requiring conversion to a D-C signal form.

Briefly stated, in accordance with certain aspects of the invention, a filter is provided which uses a cyclic pulse-width signal storage device, a binary-rate-multiplier, and gating circuits. Input pulse-width signals are compared with the stored pulse-width signal, and the resulting pulse difference signals are effectively multiplied by the time constant before introducing them to storage. The cyclic stored pulse-width signals are generated by a pair of parallel clock driven counters. The pulses to one counter are gated so as to produce the desired output phase relationship with the other counter which is the master counter or reference. The latter also serves as the major component of the divider, which is preferably a degenerative form of a binary-rate-multiplier. A modified closed loop storage results which permits change of the stored signal at a maximum rate inversely proportional to the time constant. Low-pass signals are available at a point in the loop where the stored pulse appears and the high-pass signals are available from a point after comparison with the input signal.

The invention, together with further objects and advantages thereof, may best be understood by referring to the following description taken in conjunction with the appended drawings in which like numerals indicate like parts and in which.

Figure 1:
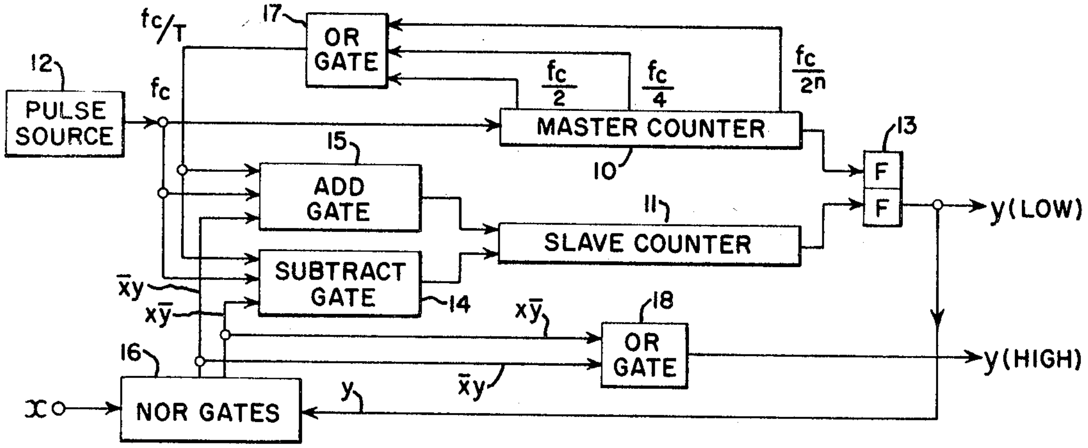
FIG. 1 is a block diagram of a simple embodiment of the invention with respective high-pass and low-pass output terminals available.

The filter of FIG. 1 is basically a prior art pulse-width integrator of the type disclosed by Seegmiller in U.S. Pat. No. 3,263,066 with additional apparatus as hereinafter described. The counters 10 and 11 each respond to a common source 12 of constant frequency pulses to generate square-wave current signals having a 50% duty cycle. A flip-flop circuit 13 compares the two counters' output waveforms. The master counter 10 "SETS" flip-flop 13 and slave counter 11 "RESETS" it. As a result, the output of flip-flop 13 is a rectangular wave signal for which the pulse-width is determined by the relative phase of counters 10 and 11. A symmetrical square-wave (50% duty cycle) is selected to represent zero for the stored variable so that both positive and negative values can be employed.

The master counter 10 is normally a basic system component for several functions. Its capacity and the frequency $f_c$ determine the pulse-width cycle duration and its starting time. Because the same master counter 10 is employed in generating the input pulse-width signal, the output of flip-flop 13 is inherently synchronized with the input pulse-width signal. As a result, the stored pulse-width signal is readily updated by a direct real-time comparison of the pulses. When the pulses are coextensive in time, no change is required. When an input pulse is of a duration different from the preceding pulse, direct detection of how much shorter or longer it is provides the desired correction.

The difference between the input $x$ and storage output $y$ changes the relative counter phase by changing the number of the pulses applied to slave counted 11. Inputs to SUBTRACT gate 14 delays the counter 11 waveform. Normally, the constant frequency pulses $f_c$ pass through gate 14 without being affected, as if they were applied to counter 11 directly. But whenever the input pulse $x$ is longer than $y$, the $f_c$ pulses are interrupted over the time difference. This causes a delay in the slave counter waveform equal to the interruption time. ADD gate 15 includes a multivibrator which generates an extra count pulse in response to each $f_c$ pulse, but delayed so as to fall between $f_c$ pulses. Gate 15 passes these pulses to the slave counter 11 whenever the stored pulse $y$ is longer than the input pulse. This causes the counter 11 waveform to advance by the time increment $y-x$.

The apparatus described to this point is a prior art variable pulse-width storage device of the type described in Pat. No. 3,263,066 issued July 26, 1966 to Walter R. Seegmiller. It samples a variable once each cycle and provides a pulse-width signal having a certain maximum or full-scale duration. A scale factor is selected such that no expected value of the input variable will exceed the limit determined by the full-scale pulse-width level and the scale factor. In respect to maximum slewing rates in the arrangement described herein, the absolute value of the stored signal can change by the full maximum absolute amount from sample to sample.

Figure 2:
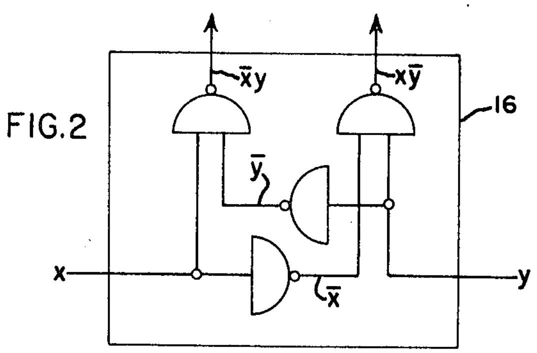
FIG. 2 is a block diagram of one implementation of NOR gates for production of pulse width signals used to control the ADD and SUBTRACT functions.

It has been discovered that by replacing the $f_c$ pulses applied to slave counter 11 with $f_c/T$ pulses during time increments $y-x$ where T is the filter time constant, signal filtering is performed. It has also been found that the time constant factor can be obtained by directly setting it as an input to a binary rate multiplier. Accordingly, subtract gate 14 and add gate 15 are modified so that pulses $f_c/T$ are used during the incremental time period. The switching logic required is simple and straightforward. The signal for subtract gate 14 or add gate 15 is provided by gate 16 which, as illustrated in FIG. 2, includes two NOR gates and two inverters. This produces two pulse width output signals $\bar{x}y$ and $x\bar{y}$, the duration of which represents the difference between the pulse width signals $x$ and $y$. If $x$ is larger than $y$, the output is $\bar{x}y$. $x\bar{y}$ operates add gate 15; $x\bar{y}$, subtract gate 14, to add or subtract pulses to the input of the slave counter. Therefore master counter 10 counts clock pulses $f_c$ and the slave counter 11 counts pulses which are clock pulses as modified by the add or subtract gate. The gates 14 and 15 themselves are any combination of electronic components which will accomplish the purpose. Gate 15, for example, is any arrangement that will permit continuous passage of $f_c$ pulses and will also pass all $f_c/T$ pulses occurring during the duration of an $\bar{x}y$, which is a pulse width significant pulse.

Although several types of electronic counters are useable, binary ripple counters of the type described in "Digital Counters and Computers," Ed Bukstein, published by Rinehard and Company, N.Y., 1960 permit a convenient implementation of this invention. Because master counter 10 operates as a frequency divider, it is a convenient source of binary related, constant pulse rate, signals. By selectively connecting counter stages to a combining circuit, OR gate 17, any desired frequency is obtained. When the selection which is a sum of any combination of outputs ($f_c/2$, $f_c/4$ . . . $f_c/2^n$) of the frequency divider can be made in accordance with a filter time constant T, the output of OR gate 17 is $f_c/T$ which is the equivalent of the RC time constant in a conventional RC filter.

The memory loop provides two outputs, $y$ (low) being the low-pass output and $y$ (high) being high-pass output in accordance with the basic filter relationship (in Laplace notation):

$$y\ (\text{low})=x/(1+sT)=x/(1+j\omega T)\approx(1/T)\Sigma(x-y)\Delta t$$

$$y\ (\text{high})=x\cdot sT/(1+sT)\approx x-(1/T)\Sigma y\Delta t$$

By limiting the rate at which the memory device can follow input variables, the regular memory output is a low pass filter output. It passes signals from D-C to the frequency corresponding to the rate limit. Higher frequencies appear at the output of gate 16. When the input $y$ is greater than $x$, slave counter 11 is delayed by subtractor 14 so that the phase differential at flip-flop 13 is increased. The application of $f_c$ pulses to counter 11 is stopped and the difference between the $f_c$ pulses and the pulses $f_c/T$ for filtering from gate 17 is applied to the slave counter during the time increment between the termination of $y$ and the termination of $x$. OR gate 18 permits an output terminal for $y$ (high) by providing at one place either signal $\bar{x}y$ or $x\bar{y}$ as it occurs and in effect is the quantitative difference in signals $x$ and $y$ without regard to which is larger.

Function of a device according to the invention may be explained by reference to FIG. 1 wherein an input pulse-width signal $x$ is gated in 16 with pulse-width signal $y$ to produce either differential output $\bar{x}y$ or $x\bar{y}$ depending on which pulse-width $x$ or $y$ is larger. The $\bar{x}y$, $x\bar{y}$ signals which are also pulse-width are used to establish a gating period in the respective add or subtract gate 15, 14 so as to advance or retard slave counter 11 by an amount proportional to the difference between $x$ and $y$ pulse-widths. ADD/SUBTRACT gating is of pulses from two sources, the regular $f_c$ clock pulses from source 12 and $f_c/T$ pulses from OR gate 17. $f_c/T$ pulses, physically made up of combinations of the binary related pulses produced at various stages of master counter 10, are selected to represent the time constant T. Therefore ADD/SUBTRACT gating either adds $f_c/T$ pulses to $f_c$ pulses during the time period $\bar{x}y$ or cancels $f_c$ pulses at a $f_c/T$ rate during the period $x\bar{y}$ to put into slave counter 11 a representation of $f_c\pm(x-y)f_c/T$. As long as $x$ and $y$ are different, the input to the slave counter is different from the $f_c$ input to the master counter and $y$ will change toward achieving equality with $x$. The change proceeds rapidly at first, decreasing until an $x=y$ state produces no further change. Plotting of $y$ as a function of time produces a logarithmic curve corresponding to the time plot of a charging capacitor.

When the preferred embodiments are employed in directly compatible pulse-width signal control systems, most of the filter components are pre-existing for other functions. A master counter and source of clock pulses are basic to the system for timing the computer cycles and as a reference for substantially all data processing operations during each cycle. The additional components required are merely common digital logic gates and the simplest counters.

While particular embodiments of the invention have been shown and described herein, it is not intended that the invention be limited to such disclosure, but that changes and modifications can be made and incorporated within the scope of the claims.

What is claimed is:

1. A filter for analog signals comprising:

(a) a pulse-width signal integrator including a master and a slave counter connected in parallel between a source of a first constant frequency pulse signal and circuit means for generating a pulse-width output signal and including gating circuitry interposed between said source and said slave counter;

(b) means for introducing an analog input signal to said gating circuitry in pulse-width form;

(c) a source of a second constant frequency pulse signal of frequency different from said first signal and representing the function according to which said input signal is to be filtered;

(d) said gating circuitry being responsive to said input signal, to said second constant frequency pulse signal and to said pulse-width output signal for modifying said first constant frequency pulse signal enroute to said slave counter in accordance with those other signals.

2. The filter of claim 1 wherein:

(e) said gating circuitry includes first and second gating stage means;

(f) said first gating stage means is responsive to said input signal and said output signal and produces pulse-width differential signals wherein the pulse-width is a measurement of a difference between said input and output signals; and (g) said second gating stage means is responsive to said differential signals and adds or subtracts the pulse count of said second signal to that of said first signal during the pulse duration of said differential signals.

3. The filter of claim 2 wherein:

(h) said differential signals are of two different kinds depending on whether the input signal or output signal pulse-width is the longer; and (i) said second gating stage means includes an add gate and a subtract gate each responsive to one of said kinds of differential signals;

(j) said gating circuitry also includes an output gate responsive to said differential signals for producing a second output signal which is the sum of said differential signals.

4. The filter of claim 1 wherein:

(e) said second constant frequency pulse signal is of frequency $f_c/T$ wherein $f_c$ is the frequency of said first constant frequency pulse signal and T is the filter time constant of the desired filter operation.

5. The filter of claim 4 wherein:

(f) said source of a second constant frequency pulse signal includes a binary frequency divider responsive to said first constant frequency pulse signal and having stages producing signals at frequencies of $f_c/2, f_c/4 \ldots f_c/2^n$, and (g) said source of a second signal also includes a combining circuit to create said $f_c/T$ by a combination of a plurality of said signals at frequencies of $f_c/2^n$.

6. The filter of claim 1 wherein:

(e) said filter includes a source of a third constant frequency pulse signal of frequency different from said first and said second signals and representing a second function according to which said input signal is to be filtered;

(f) said filter includes a second slave counter; and (g) said slave counters being responsive through said gating circuitry, one to said second, the other to said third constant frequency pulse signal whereby an analog input signal in pulse-width form can be filtered according to two criteria.

7. The filter of claim 3 wherein:

(k) said second constant frequency pulse signal is of frequency $f_c/T$ wherein $f_c$ is the frequency of said first constant frequency pulse signal and T is the filter time constant of the desired filter operation.

References Cited

UNITED STATES PATENTS

| | | | |
|---|---|---|---|
| 3,263,066 | 7/1966 | Seegmiller | 235—150.5 |
| 3,177,349 | 4/1965 | Zaborsky | 235—152 |
| 3,330,943 | 7/1967 | Hawkins | 235—15.5 |

MALCOLM A. MORRISON, Primary Examiner

E. J. WISE, Assistant Examiner

UNITED STATES PATENT OFFICE
CERTIFICATE OF CORRECTION

Patent No. 3,515,859 June 2, 1970

Hermann Schmid

It is certified that error appears in the above identified patent and that said Letters Patent are hereby corrected as shown below:

Column 3, line 37, "$x\bar{y}$", first occurrence, should read -- $\bar{x}y$ --; line 46, "$\bar{x}y$" should read -- xy --. Column 6, cancel line 6 up to and including line 17; line 18, "7." should read -- 6. --. In the heading to the printed specification, line 7, "7 Claims." should read -- 6 Claims. --.

Signed and sealed this 12th day of January 1971.

(SEAL)
Attest:

Edward M. Fletcher, Jr.
Attesting Officer

WILLIAM E. SCHUYLER, JR.
Commissioner of Patents